(12) United States Patent
Moon et al.

(10) Patent No.: US 8,490,683 B2
(45) Date of Patent: Jul. 23, 2013

(54) FLAT PLATE TYPE MICRO HEAT TRANSPORT DEVICE

(75) Inventors: Seok Hwan Moon, Daejeon (KR); Gunn Hwang, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 457 days.

(21) Appl. No.: 12/744,669

(22) PCT Filed: Apr. 21, 2008

(86) PCT No.: PCT/KR2008/002230
§ 371 (c)(1),
(2), (4) Date: May 25, 2010

(87) PCT Pub. No.: WO2009/072703
PCT Pub. Date: Jun. 11, 2009

(65) Prior Publication Data
US 2010/0243214 A1    Sep. 30, 2010

(30) Foreign Application Priority Data
Dec. 4, 2007  (KR) .................. 10-2007-0125098

(51) Int. Cl.
*F28D 15/00* (2006.01)
*F28F 7/00* (2006.01)
*H05K 7/20* (2006.01)

(52) U.S. Cl.
USPC ............... 165/104.26; 165/104.33; 165/80.3; 361/700

(58) Field of Classification Search
USPC ............... 165/104.26, 104.33, 80.3; 361/700
See application file for complete search history.

(56) References Cited

U.S. PATENT DOCUMENTS
3,568,762 A * 3/1971 Harbaugh ............... 165/104.26
5,179,043 A  1/1993 Weichold et al.
(Continued)

FOREIGN PATENT DOCUMENTS
JP   2001-227852 A   8/2001
KR  1020030018478 A   3/2003
KR  1020040032471 A   4/2004
KR  1020060059507 A   6/2006
WO  WO 2006062371 A1 *  6/2006

OTHER PUBLICATIONS

Jeffrey Kirshberg et al., "Cooling Effect of a MEMs Based Micro Capillary Pumped Loop for Chip-Level Temperature Control," 2000, pp. 1-8, ASME.

(Continued)

*Primary Examiner* — Frantz Jules
*Assistant Examiner* — Erik Mendoza-Wilkenfel

(57) ABSTRACT

There is provided a flat plate type micro heat transport device formed of two plates coupled with each other to be opposite to each other, each of the plates includes: a reservoir formed to store a moving fluid charged via an inlet; a evaporator formed separated from the reservoir to generate vapor having latent heat by vaporizing the moving fluid; a vapor flow path formed to be connected to the evaporator, through which the vapor having latent heat is transported; a condenser formed to be connected to the vapor flow path and to condense the vapor having latent heat; and a liquid flow path formed to be connected to the condenser and the evaporator and separately from the vapor flow path to transport a liquid obtained by condensing the vapor. The device may efficiently control heat with respect to portable electronic devices by effectively transporting heat generated by a heat source.

10 Claims, 3 Drawing Sheets

U.S. PATENT DOCUMENTS

| | | | |
|---|---|---|---|
| 6,651,735 B2 | 11/2003 | Cho et al. | |
| 6,679,316 B1 * | 1/2004 | Lin et al. | 165/104.26 |
| 6,785,135 B2 | 8/2004 | Ohmi et al. | |
| 7,184,265 B2 * | 2/2007 | Kim et al. | 361/679.47 |
| 7,188,484 B2 * | 3/2007 | Kim | 62/259.2 |
| 7,237,337 B2 * | 7/2007 | Yeh et al. | 29/890.032 |
| 7,971,633 B2 * | 7/2011 | Moon et al. | 165/104.26 |
| 2003/0066625 A1 | 4/2003 | Kirshberg et al. | |
| 2003/0159806 A1 * | 8/2003 | Sehmbey et al. | 165/80.3 |
| 2006/0157227 A1 * | 7/2006 | Choi et al. | 165/104.21 |
| 2009/0178784 A1 * | 7/2009 | Wang | 165/104.26 |
| 2011/0030925 A1 * | 2/2011 | Yang et al. | 165/104.26 |

OTHER PUBLICATIONS

D. Khrustalev et al., "Thermal Analysis of a Micro Heat Pipe," Journal of Heat Transfer, Feb. 1994, pp. 189-198, vol. 116, ASME.

B. R. Babin et al., "Steady-State Modeling and Testing of a Micro Heat Pipe," Journal of Heat Transfer, Aug. 1990, pp. 595-601, vol. 112, ASME.

International Search Report for PCT/KR2008/002230 filed Apr. 21, 2008.

Written Opinion of the International Searching Authority for PCT/KR2008/002230 filed Apr. 21, 2008.

\* cited by examiner

FLAT PLATE TYPE MICRO HEAT TRANSPORT DEVICE

TECHNICAL FIELD

The present invention relates to a flat plate type micro heat transport device, and more particularly, to a flat plate type micro heat transport device having a thin thickness, which is driven by vapor-liquid two phase fluid mechanism.

BACKGROUND ART

Recently, high integration and subminiaturization of various easily portable electronic communication devices such as notebooks and sub notebooks are rapidly accelerated. Particularly, personal mobile electronic communication devices are rapidly miniaturized and become ultrathin.

Such electronic communication devices keep controlling heat by providing a space for heat dissipation therein. However, due to rapid changes in structures of electronic communication devices, there are a lot of limitations on sizes in heat control methods capable of being applied to various devices and it is difficult to provide a space for heat control.

As generally applied methods, there is a method in which a material having an excellent thermal conductivity is designed suitable for a packaging structure of a device in such a way that simple heat conduction is performed due to solid. In addition, as representative methods, there are a fan and heat pipe type and liquid circulation type.

The fan and heat pipe type is generally employed in portable notebooks, in which a vent hole is formed on a chassis portion of a device and heat transported from a heat source via a heat pipe is dissipated via the vent hole.

The liquid circulation type such as liquid cooling is most traditional, which is not yet applied to portable electronic communication devices but has a greater ability of heat transport than other cooling methods.

DISCLOSURE OF INVENTION

Technical Problem

Such heat control technologies are presently estimated as more effective technologies capable of being applied to small-sized portable electronic communication devices. However, as a structure of electronic packaging is gradually miniaturized and highly integrated, there is a limitation in such heat control technologies and it is considered as there will be more limitations in the future.

In the case a volume of a packaging structure, particularly, a thin type structure, it is difficult to have a thin thickness while heat is transported to a relatively long distance. In the case of a small heat pipe, due to a limitation on a packaging structure, when a thickness is compressed to 2 mm or less, heat transport performance is greatly reduced and it is difficult to transport heat for a distance more than 50 mm. Since other heat control technologies include defects in a heat conductivity or volume thereof, it is difficult to apply the technologies.

In addition, heat control technologies capable of being applied to a narrow space gradually meet with limitations. Representatively, it is required to reduce volumes of heat sinks, metal blocks, and fan, which are generally used so far. However, considering that heat dissipation efficiency is improved by simply providing a broad heat transport area, there are shown problems in heat design. Accordingly, it is required to effectively dissipate heat in a narrow and thin space that is limited.

Accordingly, to solve the described problems, an aspect of the present invention provides a flat plate type micro heat transport device having a thin thickness, the device driven by vapor-liquid two phase fluid mechanism.

Technical Solution

According to an aspect of the present invention, there is provided a flat plate type micro heat transport device formed of two plates coupled with each other to be opposite to each other, each of which includes: a reservoir formed to store a moving fluid charged via an inlet; a evaporator formed separated from the reservoir to generate vapor having latent heat by vaporizing the moving fluid; a vapor flow path formed to be connected to the evaporator, through which the vapor having latent heat is transported; a condenser formed to be connected to the vapor flow path and to condense the vapor having latent heat; and a liquid flow path formed to be connected to the condenser and the evaporator and separately from the vapor flow path to transport a liquid obtained by condensing the vapor.

The two plates may have the same configuration and the same size.

The device may have an envelope shape having an enclosed structure.

The moving fluid may have two-phase fluid states of a liquid and vapor and is circulated via the reservoir, the evaporator, and the condenser by using the vapor flow path and the liquid flow path, which are separately formed, according to the two-phase fluid states.

The inlet is formed in the shape of a hole on a side of the each of the two plates to pour the moving fluid into the reservoir.

The vapor flow path may be formed in the shape of a line having a cross-section greater than that of the liquid flow path.

The vapor flow path may have a groove having a sparse structure to scatter the liquid obtained by condensing the vapor.

The liquid flow path may be formed in the shape of one line on both sides of the vapor flow path, respectively.

The evaporator may be formed in a two-part capillary structure having a shape of groove.

The groove may be formed in a structure having a cross-section becoming narrow at a point where the evaporator and the liquid flow path meet each other.

The evaporator may be formed by further inserting one of a sintered wick, a fiber wick, a screen mesh wick, a fine fiber wick, and a woven wire wick.

The condenser may have a serpentine configuration in the shape of a line.

Advantageous Effects

According to the present invention, there are is provided an effect of efficiently controlling heat of portable electronic devices, in which a flat plate type thin structure and vapor and liquid flow paths, separately formed, are provided, thereby removing fluid pressure drop caused by friction at an interface between vapor and a liquid in such a way that it is advantageous to high-heat flux and heat-transport for a relatively long distance.

Also, since a thickness of the flat plate type micro heat transport device is 2 mm or less, the device is suitable for subminiature portable electronic devices. Particularly, the device is very effective when an electronic package structure of a device is very narrow.

Due to a structure of coupling two plates having the same configuration and the same size, it is possible to produce plates of only one type. Accordingly, it is possible to improve productivity and reduce manufacturing costs.

BEST MODE FOR CARRYING OUT THE INVENTION

Figure 1:
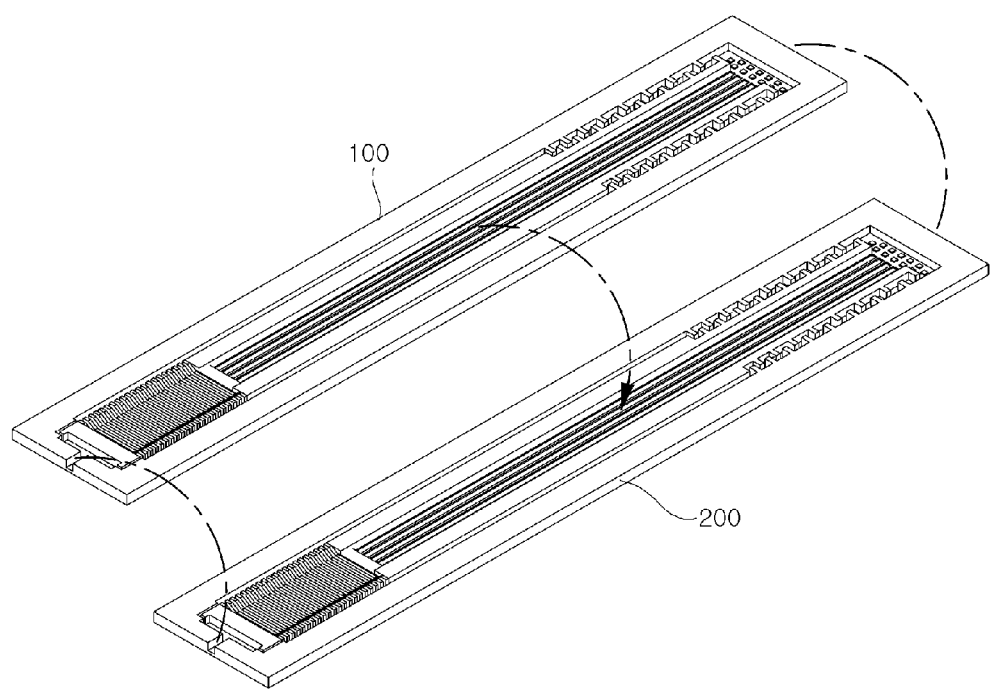
FIG. 1 is a perspective view illustrating two plates having the same configuration and size, before being coupled with each other to form a flat plate type micro heat transport device according to an exemplary embodiment of the present invention.

Hereinafter, exemplary embodiments of the present invention will now be described in detail with reference to the accompanying drawings.

Only, in describing operations of the exemplary embodiments in detail, when it is considered that a detailed description on related well-known functions or constitutions unnecessarily may make essential points of the present invention be unclear, the detailed description will be omitted.

Also, in the drawings, the same reference numerals are used throughout to designate the same or similar components.

FIG. 1 is a perspective view illustrating separated top and bottom plates to show an overall structure of a flat plate type micro heat transport device according to an exemplary embodiment of the present invention.

Referring to FIG. 1, the flat plate type micro heat transport device is formed in an envelope shape having an enclosed structure including top and bottom plates 100 and 200 having the same configuration and the same size, which are coupled with each other. The flat plate type micro heat transport device has a thickness of 2 mm or less, which is very thin.

When pouring a moving fluid into the flat plate type micro heat transport device formed of the envelope having the enclosed structure, heat exchange is performed by phase-change heat transport.

That is, the flat plate type micro heat transport device according to an exemplary embodiment of the present invention may be manufactured by simply connecting the two plates having an internal structure generating fluid mechanism of two phases such as a liquid and vapor. Also, since a evaporator having a capillary structure generating the liquid-vapor two phase fluid mechanism, vapor and liquid flow paths, a condenser, and a reservoir are installed in one plate, a structure thereof is very simple and has competitive manufacturing costs.

A detailed configuration of each of the two plates forming the flat plate type micro heat transport device will be described with reference to FIG. 2.

Figure 2:
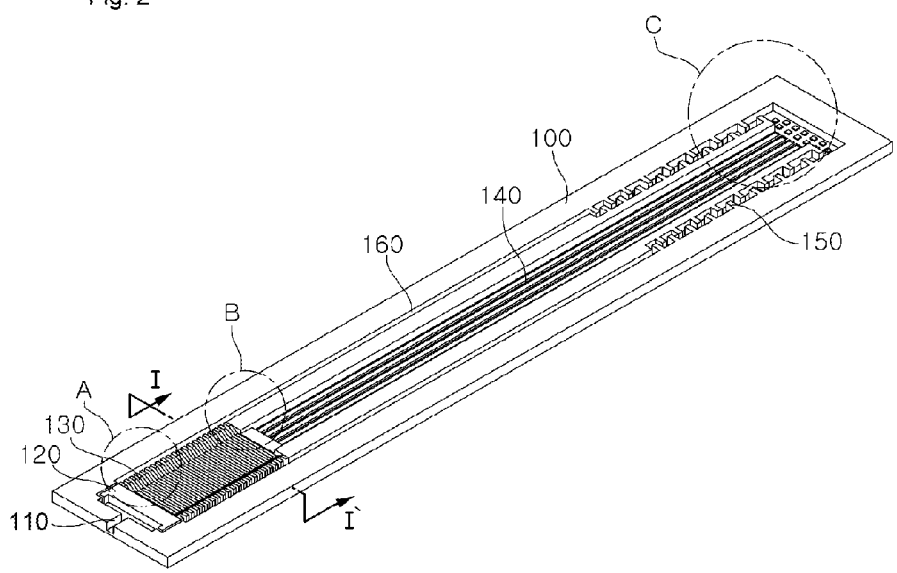
FIG. 2 is a configuration diagram illustrating one of the two plates forming the flat plate type micro heat transport device according to an exemplary embodiment of the present invention.

FIG. 2 is a configuration diagram illustrating one of the two plates forming the envelope having the enclosed structure formed by coupling the two plates 100 and 200 of FIG. 1. In this case, since the two plates 100 and 200 have the same configuration and the same size, respectively, the configuration of the plate 100 will be described.

Referring to FIG. 2, the plate 100 includes an inlet 110 formed in the shape of a hole on a side of the envelope, through which a moving fluid flows in, a reservoir 120 storing the moving fluid flowing through the inlet 110, a evaporator 130 having a two-part capillary structure, which vaporizes the moving fluid into vapor having latent heat, a vapor flow path 140 formed in the shape of a line to transport the vapor, a condenser 150 having a serpentine channel configuration to quickly condense the vapor transported via the vapor flow path 140, and a liquid flow path 160 formed in the shape of a line to transport a liquid obtained by condensing the vapor at the condenser 150 to the evaporator 130.

On the other hand, in the present embodiment, though the flat plate type micro heat transport device is formed of one envelope formed by coupling two plates, each of the two plates includes a evaporator, a condenser, vapor and liquid flow paths, and a reservoir, thereby independently circulating a moving fluid by phase change operation mechanism. Accordingly, since the two plates have the same configuration and the same size, it is possible to reduce manufacturing costs thereof.

The flat plate type micro heat transport device may have a thickness and a length capable of being adaptively controlled according to heat density of electronic devices. Positions of a evaporator and a condenser and courses of liquid and vapor flow paths may be also freely designed. Accordingly, application thereof is very great. That is, there are provided various shapes according to various internal packaging structures of portable electronic communication devices.

The detailed configuration of the plate 100, shown in FIG. 2, will be described in detail with reference to (a) to (d) of FIG. 3.

Figure 3:
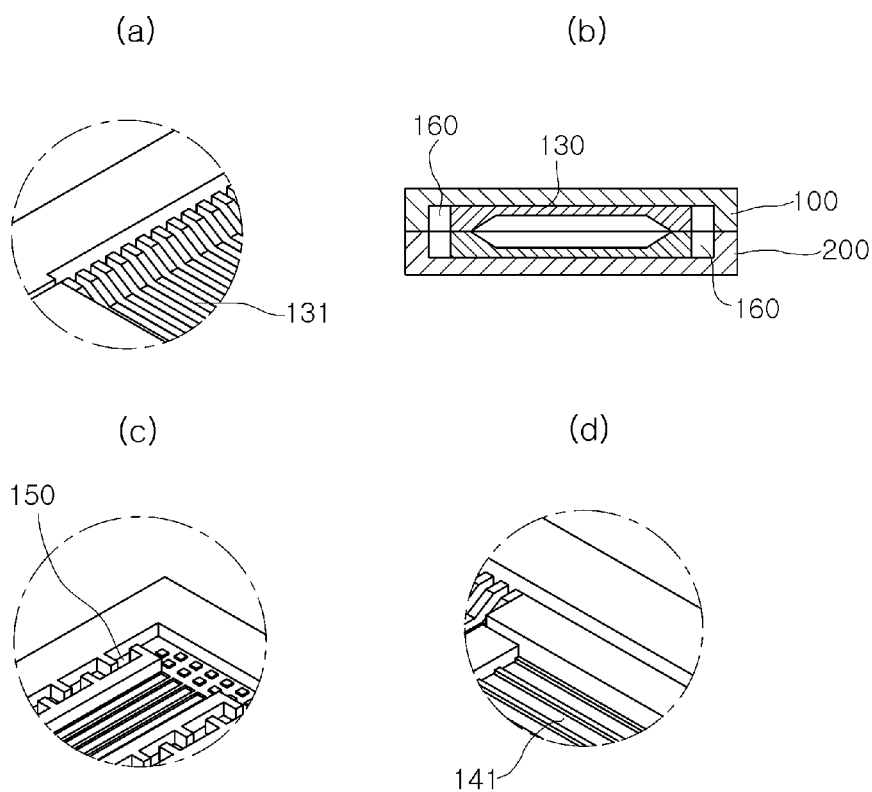
FIG. 3 is a detailed drawing illustrating one of the two plates that form the flat plate type micro heat transport device in FIG. 2, (a) of FIG. 3 is an enlarged view of A of FIG. 2, in which a two-part capillary structure of a evaporator is shown; (b) of FIG. 3 is a cross-sectional view illustrating the plate of FIG. 2, cut along a line I-I'; (c) of FIG. 3 is an enlarged view of C of FIG. 2, in which a condenser having a serpentine channel configuration is shown; and (d) of FIG. 3 is an enlarged view of B of FIG. 2, in which a sparse groove structure of a vapor flow path is shown.

(a) of FIG. 3A is an enlarged view of A of FIG. 2, in which the two-part capillary structure of the evaporator 130 is shown; (b) of FIG. 3 is a cross-sectional view illustrating the plate 100, cut along a line I-I' as shown in FIG. 2; (c) of FIG. 3 is an enlarged view of C of FIG. 2, in which the condenser 150 having the serpentine channel configuration is shown; and (d) of FIG. 3 is an enlarged view of B of FIG. 2, in which a sparse groove structure of the vapor flow path 140 is shown.

Referring to (a) of FIG. 3, the evaporator 130 is separated from the reservoir 120 at a certain interval, and vaporizes the moving fluid transported through the liquid flow path 160. The evaporator includes the two-part capillary structure and has grooves 131. The grooves 131 may reduce loads of capillary force, thereby improving heat transport performance.

The grooves 131 formed in the evaporator 130 may be designed as a structure in which a cross-section suddenly becomes narrow at both sides where the grooves 131 meet the liquid flow path 160. As designed like above, it is possible to prevent a backflow of vapor bubbles generated in the grooves 131 in the evaporator 130. Accordingly, there is no need to manufacture an additional structure.

In the evaporator 130, an additional wick such as a sintered wick, a fiber wick, a screen mesh wick, a fine fiber wick, and a woven wire wick may be further inserted.

(b) of FIG. 3 is a cross-sectional view illustrating the plate 100, cut along a line I-I' as shown in FIG. 2. Referring to (b)

of FIG. 3, when coupling the two plates 100 with 200 having the configuration shown in (a) of FIG. 3, as top and bottom plates, a broad vapor space is provided in the middle of the evaporator 130 which has the two-part capillary structure.

That is, the evaporator 130 of each of the two plates 100 and 200 has two-part capillary structure, thereby providing a vapor space in addition to the grooves 131 generating the capillary force. Also, the envelope is formed by coupling the two plates 100 and 200 having the same configuration, to be opposite to each other, thereby providing an overall vapor space formed of the vapor spaces of the evaporator 130 included in each of the plates 100 and 200.

Referring to (c) of FIG. 3, the condenser 150 has a serpentine configuration in the shape of a line, which provides an increased contact area, thereby quickly dissipating heat of the vapor having latent heat, transported from the evaporator 130, and condensing the vapor.

Referring to (d) of FIG. 3, the vapor flow path 120 is formed in a center portion of the flat plate type micro heat transport device, in the shape of one line connected to the evaporator 130 and the condenser 150 to transport the vapor having latent heat from the evaporator 130 to the condenser 150.

Due to the thin thickness of the flat plate type micro heat transport device, the vapor generated at the evaporator 130 may be condensed at the vapor flow path 140 before being transported to the condenser 150. To prevent this, grooves 141 having a sparse structure is formed to disperse a condensed liquid at the vapor flow path 140.

Also, the liquid flow path 160 is formed in one pair of lines on both sides of the vapor flow path 120 to circulate the moving fluid passing through the evaporator 130 via the condenser 150 to the evaporator 130.

In this case, in the present embodiment, one or two liquid flow paths may be employed. When there are two liquid flow paths, capillary force of a evaporator, which may be relatively smaller, may be complemented, thereby improving heat transport performance of the overall flat plate type heat transport device. That is, the number of the liquid flow path in the present embodiment may be, but not limited to, one.

A cooling process at the flat plate type micro heat transport device shown in FIGS. 1 to 3 will be described. The inside of the flat plate type micro heat transport device is made to be vacuous and is filled with a moving fluid via the inlet 110. Heat transported from a heating source (not shown) to the evaporator 130 vaporizes the moving fluid into vapor having latent heat. The vapor having latent heat is transported to the condenser 150 via the vapor flow path 140 by a pressure difference.

The condenser 150 dissipates heat of the vapor having latent heat and condenses the vapor into a liquid. The liquid is transported to the evaporator 130 via the liquid flow path 160.

As described above, when heat flows into the evaporator 130, a circulation process is repeated, in which the heat is transported to the condenser 150, in the form of vapor having latent heat, is condensed at the condenser 150, and returns to the evaporator 130.

In this case, different from conventional heat pipes in which vapor and a liquid flow in the same path, in the form of a counter flow, in the present embodiment, vapor and a liquid flow using different flow paths, respectively, such as the vapor flow path 140 and the liquid flow path 160. Accordingly, since there is no a pressure drop due to frictional resistance at an interface between the vapor and the liquid, the flat plate type micro heat transport device may have a relatively more excellent heat transport ability than the conventional heat pipes.

While the present invention has been shown and described in connection with the exemplary embodiments, it will be apparent to those skilled in the art that modifications and variations can be made without departing from the spirit and scope of the invention as defined by the appended claims.

The invention claimed is:

1. A flat plate type micro heat transport device comprising top and bottom plates coupled to each other, each of the top and bottom plates comprising:
   an inlet;
   a reservoir configured to store a moving fluid that is provided into the reservoir via the inlet;
   an evaporator separated from the reservoir, and configured to vaporize the moving fluid into vapor;
   a vapor flow path connected to the evaporator and configured to transport, the vapor;
   a condenser connected to the vapor flow path and configured to condense the vapor into liquid; and
   a liquid flow path connected to the condenser and the evaporator, and separated from the vapor flow path, the liquid flow path being configured to transport the liquid from the condenser to the evaporator wherein the reservoir, the evaporator, the vapor flow path, the condenser, and the liquid flow path of the top and bottom plates are mirror images of one another.

2. The device of claim 1, wherein the moving fluid has a two-phase transitional characteristic between the liquid and the vapor, and is circulated via the reservoir, the evaporator, and the condenser by using the vapor flow path and the liquid flow path, which are separated from each other.

3. The device of claim 1, wherein the inlet having a hole shape is provided on a first side of the top and bottom plates and is configured to accept the moving fluid into the reservoir.

4. The device of claim 1, wherein the vapor flow path has a first line shape, and the vapor flow path has a cross-section that is greater than the liquid flow path.

5. The device of claim 4, wherein the vapor flow path includes a plurality of grooves having a sparse structure configured to disperse condensed liquid in the vapor flow path.

6. The device of claim 1, wherein a pair of liquid flow paths having a second line shape are provided at both sides of the vapor flow path.

7. The device of claim 1, wherein the evaporator has a two-part capillary structure comprising a plurality of grooves.

8. The device of claim 7, wherein each of the grooves of the evaporator has a first width where the grooves interface with the liquid flow path, and a second width in a middle portion of the grooves, the first width being less than the second width.

9. The device of claim 1, wherein the condenser has a third line shape and a serpentine channel configuration along the third line shape.

10. The device of claim 1, wherein a thickness of the device is no greater than 2 mm.

* * * * *